United States Patent [19]
Szapucki et al.

[11] Patent Number: 6,050,216
[45] Date of Patent: Apr. 18, 2000

[54] SHOWERHEAD ELECTRODE FOR PLASMA PROCESSING

[75] Inventors: Matthew Peter Szapucki, Toms River; Richard Kulkaski, Forked River; Trevor J. Hadley, Brick; Mark Anthony Santorelli, Barnagat; Robert H. Stoever, Atlantic Highlands, all of N.J.

[73] Assignee: M.E.C. Technology, Inc., Toms River, N.J.

[21] Appl. No.: 09/137,982

[22] Filed: Aug. 21, 1998

[51] Int. Cl.⁷ .............................. C23C 16/00; H05H 1/00
[52] U.S. Cl. ........................ 118/723 E; 156/345
[58] Field of Search ...................... 118/723 E, 723 R, 118/728, 500, 503; 156/345

[56] References Cited

U.S. PATENT DOCUMENTS

| | | |
|---|---|---|
| 4,547,247 | 10/1985 | Warenback et al. . |
| 4,585,920 | 4/1986 | Hoog et al. . |
| 4,612,077 | 9/1986 | Tracy et al. . |
| 5,074,456 | 12/1991 | Degner et al. . |
| 5,262,029 | 11/1993 | Erkine et al. . |
| 5,472,565 | 12/1995 | Mundt et al. . |
| 5,569,356 | 10/1996 | Lenz et al. . |
| 5,597,439 | 1/1997 | Salzman . |
| 5,667,631 | 9/1997 | Holland et al. . |
| 5,846,332 | 12/1998 | Zhao et tal. ............................ 118/728 |
| 5,882,411 | 3/1999 | Zhao et al. ............................ 118/715 |

*Primary Examiner*—Shrive Beck
*Assistant Examiner*—P. Hassanzadeh
*Attorney, Agent, or Firm*—Kenneth Watov; Watov & Kipnes, P.C.

[57] ABSTRACT

A plasma reactor showerhead electrode assembly for processing semiconductor wafers comprised of a typically silicon disk shaped gas plate having a plurality of gas passage holes therethrough, and a graphite circular split collar assembly including first and second semicircular sections forming a circumferential inner slot when opposing ends of said sections are secured together, the slot mating in a dovetail connection with an outer circumferential groove of said gas plate for retaining the latter between said sections. A conductive gasket may be interposed between the gas plate groove and the mating collar assembly to provide an electrically and thermally conductive seal. The first and second semicircular sections have opposing ends screwed or pinned together for providing easy disassembly thereof for replacement of the gas plate.

18 Claims, 5 Drawing Sheets

SHOWERHEAD ELECTRODE FOR PLASMA PROCESSING

FIELD OF THE INVENTION

The present invention relates generally to an apparatus used in the processing of semiconductor wafers in plasma reactors, and more particularly to a composite electrode wherein the plate is clamped within a collar providing enhanced ease of assembly and disassembly.

BACKGROUND OF THE INVENTION

Plasmas are used for many processes to alter the surface of a material, such as an integrated circuit chip wafer, in a controlled manner. Typical applications include the etching of semiconductor wafers, ion implantation, ion milling, and the removal of material in a process known as reactive ion etching. The fabrication of an integrated circuit usually begins with a thin, polished slice of a high purity, single-crystal semiconductor material, such as silicon, or germanium, which is subjected to a sequence of processing steps, such as deposition of materials on, or removing materials from the wafer to form the structured layers of the integrated circuit. Early etching techniques were based on chemical etching agents. Early deposition processes included sputtering or chemical vapor deposition techniques. More recently, etching and deposition processes based on energetic plasma ions taking place in a plasma reactor, have been replacing the earlier techniques because of environmental and health concerns, in addition to the improved quality which results from the plasma process.

Plasma reactors typically include a chamber in which the plasma is established, a source of gas which is ionized to form the plasma, a source of energy to ionize the gas, a vacuum system to reduce the pressure within the chamber to the appropriate level for the particular process, and a means for allowing the gas to enter the chamber in a controlled manner.

Generally, the item to be processed, which may typically be a semiconductor wafer with appropriate masking, is placed within the chamber and is electrically biased relative to the gas in order to induce the charged species of the ionized gas to impinge on the wafer preferably substantially normal to the surface. In some cases, chemically reactive gases are also used to enhance the rate of etching in a process called reactive ion etching.

In a typical plasma etching system, the chamber has an upper electrode which serves as an anode, and a lower electrode which serves as a cathode. The item to be processed is generally mounted on the cathode. In such a system, the cathode is biased negatively with respect to the anode and the chamber walls, and thereby establishes an electric field between the cathode and the surrounding region. The electric field gradient established by the negatively biased cathode is sufficiently strong enough to dissociate the particular gas used in the chamber, at the operating pressure to form a plasma. The dissociated gas results in charged particles in the form of electrons and positively charged ions, each of which are accelerated by the electric field. The surface of the item to be processed is etched by the positive ions that are accelerated towards the negatively charged cathode by the electric field. It is generally important in semiconductor processing that the ions strike the wafer with a uniform flux density so that all parts of the wafer be processed at the same rate, and that the ions follow a path that is perpendicular to the surface of the wafer in order to prevent defects associated with undesirable etching of the sides of the semiconductor structures. It is also important that extraneous particles which can cause defects be eliminated, and that the components of the reactor be easily replaced or serviced.

Generally the upper electrode, the anode, is provided with gas holes in a distribution that encourages an even distribution, and uniform flow, of plasma over the surface of the article to be processed. Typically, the anode is comprised of a silicon disk of uniform thickness, and is referred to as a showerhead electrode in the art. When gases which are chemically reactive with the material to be etched, are used in the process known as reactive ion etching, the energetic etching properties of the plasma process are combined with the chemical etching effect of the reactive gas. Reactive gases typically contain compounds of highly reactive elements, such as chlorine, bromine or fluorine, generally in a mixture with other gases such as oxygen, neon, argon, or sulphur. Other compounds, using other chemicals are also well known in the art.

One consequence of using reactive gases is that the reactive gases cause excessive electrode wear. Also, the electrons which are created by the dissociated gas are accelerated towards the anode, and cause etching and wear. A detrimental effect of the anode wear, is that the holes which form the gas inlet may change over time, and effect the process.

In certain known showerhead configurations, the silicon gas plate is secured to the graphite ring using Indium which is known to bond silicon to graphite. However, there are a number of disadvantages with using Indium in the plasma reactor. There is evidence that Indium has a low level of toxicity and thus has handling and disposal problems. Indium is relatively expensive. Indium also has a high vapor pressure, which means that it easily outgases, which in the plasma reactor chamber vacuum, causes outgassing of particulates, which contributes to a creating a dirty chamber. The process for soldering the silicon gas plate to the graphite ring with Indium is difficult, because a flux cannot be used. The assembly process requires heating the silicon and graphite to drive off impurities, and then rubbing the silicon and graphite with pure Indium to produce oxides. The Indium solder then bonds to the Oxides, which is bonded to the silicon and graphite parts. The resulting solder bond is in mechanical stress, and being a relatively soft material, tends to flow since it is in a state of shear. Another disadvantage with the use of an Indium bond, is that it is the only structural support holding the silicon gas plate to the graphite ring, and if the temperature of the gas plate and ring approaches 150 C., such as may happen if the plasma process runs hot, the gas plate may fall, damaging the wafer or the reactor. Finally, the Indium solder bond is thermally cycled during the manufacturing process, which could weaken the oxide bonds, also causing a failure.

Consequently, it is desirable to have an anode showerhead assembly that is structurally reliable, and is easy to assemble and disassemble. Also, it is desirable to have a showerhead assembly which is made of materials which are compatible with the plasma and reactive etching processes in the reactor. It is also desirable to have a showerhead assembly in which the hole pattern can be changed to accommodate the process, when gas mixture, flow rate, wafer size and pressure is changed to accommodate each particular process.

SUMMARY OF THE INVENTION

It is an object of this invention to provide an improved plasma reactor showerhead electrode assembly comprised of a disk shaped gas plate, that has a number of gas passage holes distributed axisymmetrically through from one side of the disk to the other, in order to allow the passage of gas through the gas plate in a uniform and controlled manner. Typically the gas plate is made from silicon, but graphite, aluminum or any suitable material may be used. The disk shaped gas plate has a first side which faces the plasma, and a second side which faces the gas source. The gas plate has an outer peripheral edge having a peripheral groove. The groove defines a first rim proximate to the first side, and a second rim proximate to the second side.

In a preferred embodiment of the invention, the gas plate is held within a circular split collar assembly. The collar assembly material is generally graphite, although other materials may be used. The circular split collar assembly consists of two semicircular sections held together by removable bolts, screws, pins or other securing means.

In one implementation of the preferred embodiment, each semicircular section has a pair of flat parallel tongue and groove faces that abuts with a corresponding pair of flat parallel faces of the other semicircular section. Each semicircular section has a tangential through hole normal to the first parallel face of each semicircular section, and a tangential internally threaded blind hole normal to the second parallel face of each semicircular section. Each of the bolts passes through the tangential through hole, and threads into the blind hole for securing the first and second semicircular sections together.

In a second implementation of the preferred embodiment, each semicircular section has a pair of mating faces. The first face has a bifurcated region, comprised of a top projecting section, a bottom projecting section, with the two sections defining a notch between. Each projecting section has a hole. The holes are nominally the same diameter, and are axially aligned. The top projecting section hole is a through hole, and the bottom projecting section hole is either a blind hole, or a tapped hole. The second face has a tab which projects from the face, and is received by the corresponding notch on the other corresponding semicircular section. The tab has a tab hole, which, when the two semicircular sections are joined, aligns with the top projecting section through hole, and the bottom projecting section blind or tapped hole. A notch and tab securing means, such as a screw, or a pin retains the tab within the notch.

The split collar assembly has an inner cylindrical surface with a peripheral circular slot. The inner cylindrical surface slot has a first circular edge and a second circular edge on either side of the slot. In the illustrated embodiment, the circular split collar assembly has a radial flange on an outer cylindrical surface for use in mounting in the plasma reactor chamber.

When the gas plate is held in the collar assembly, the collar assembly slot receives the first rim of the gas plate. The gas plate groove receives the second circular edge of the collar assembly. A conductive gasket, which in the embodiment shown is band shaped, is situated between the gas plate groove and the collar assembly second edge to provide an electrically and thermally conductive seal. In the embodiment shown, the disk shaped gas plate outer peripheral edge peripheral groove has a rectangular cross-section, and the circular split collar assembly inner cylindrical surface has a peripheral and circular slot which also rectangular cross-section.

The method of assembling a plasma reactor electrode assembly involves the following steps in one embodiment on the invention. First an electrically and thermally conductive gasket is placed around the disk-shaped gas plate, so that it fits within the peripheral circular groove. Then two semicircular collar sections are each placed around the gas plate to form an encircling collar assembly, such that the mating inner surfaces of each semicircular section engages the grooves of the gas plate and the gasket. Each of two bolts is inserted through the tangential hole in each semicircular collar section, and threaded into each of two tangential threaded blind holes in the cooperating semicircular collar section, thus supporting and securing the gas plate within the collar section.

In another embodiment of the invention, the tab on each semicircular collar section is inserted into the corresponding notch on the other semicircular collar section and a pin or screw is inserted into the aligned holes in the tab and notch to secure the gas plate within the semicircular collar sections. The pin or screw is withdrawn to reverse the process, and remove the gas plate.

BRIEF DESCRIPTION OF THE DRAWINGS

The various embodiments of the invention are described in detail below with reference to the drawings, in which like items are identified by the same reference designations, wherein.

DETAILED DESCRIPTION OF THE INVENTION

Figure 1A:
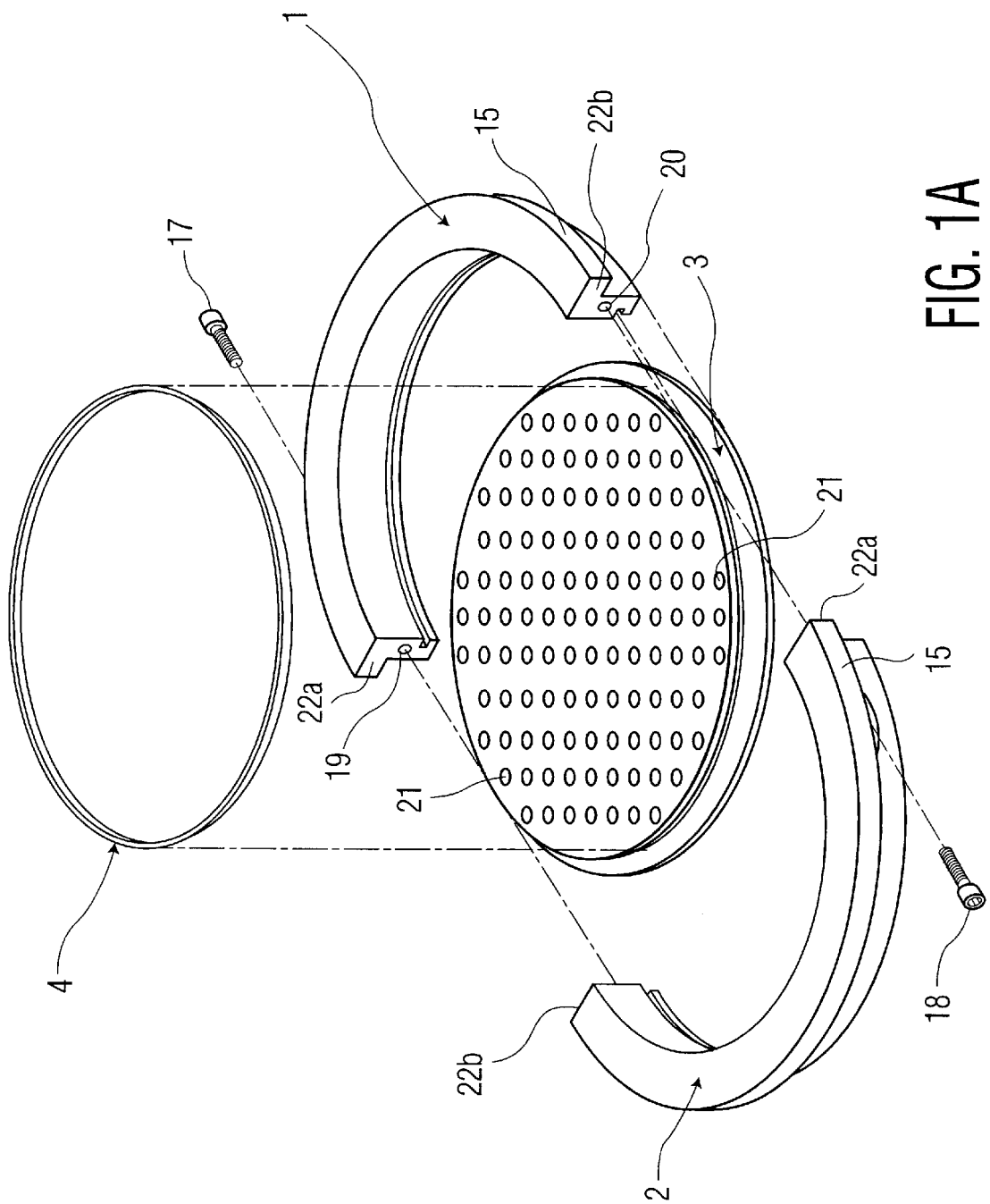
FIG. 1A is an exploded top assembly view of one embodiment of the showerhead electrode assembly, shown with the split collar assembly separated into its two semicircular parts.
Figure 1B:
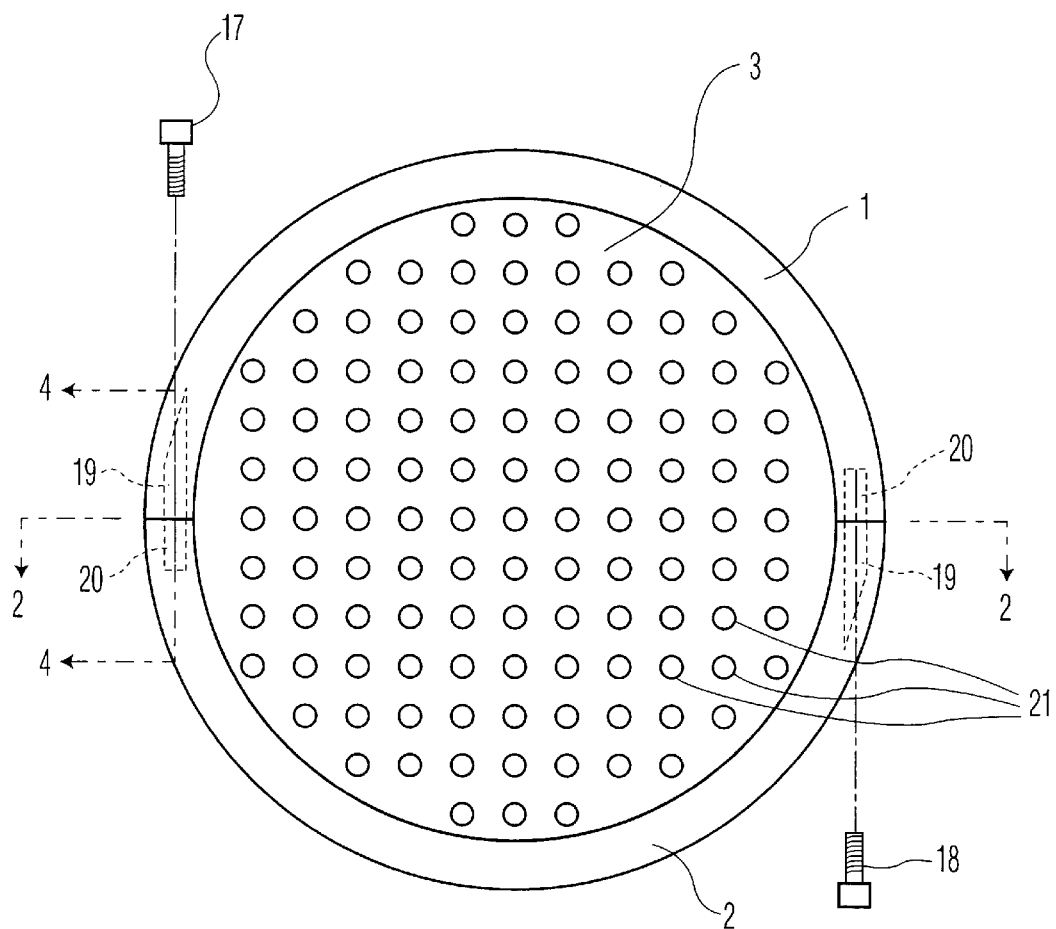
FIG. 1B is a top view of an assembled showerhead electrode of one embodiment of the invention.

In the embodiment of the showerhead electrode assembly shown in FIG. 1A, an exploded top view of the showerhead electrode assembly is shown, with the split collar assembly separated into its two semicircular sections 1 and 2. The split collar semicircular section 1 is shown separated from split collar second semicircular section 2. Gas plate 3 includes an array of through holes 21 as shown. In FIG. 1B, a top view is shown of an assembled showerhead electrode assembly with sections 1 and 2 secured together by screws 17 and 18, with each screw being inserted through a hole 19 in one section to screw into a threaded blind hole 20 of the opposing section. The gas plate 3 is captively held between semicircular sections 1 and 2, as is described in greater detail below.

Figure 2:
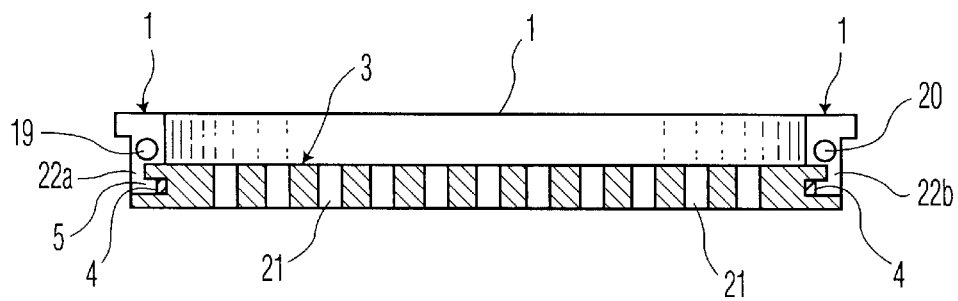
FIG. 2 illustrates a cross-sectional view of the assembled showerhead electrode assembly of FIG. 1B taken along 2—2, the view looking in the opposite direction being a mirror image.

FIG. 2 illustrates a partial cross-sectional view along the sectional line 2—2 of the showerhead electrode assembly of FIG. 1B. A cross-sectional view of the gas plate 3 is shown between the first and second parallel faces 22a and 22b of the first semicircular split collar section 1. The end faces 22a and 22b of the second semicircular split collar section 1 are a mirror image of the ends of split collar section 2. In a preferred embodiment, a band shaped circular gasket 4 is shown in the gas plate groove 5 (see FIG. 3). However, in many applications the gasket is not required.

Figure 3:
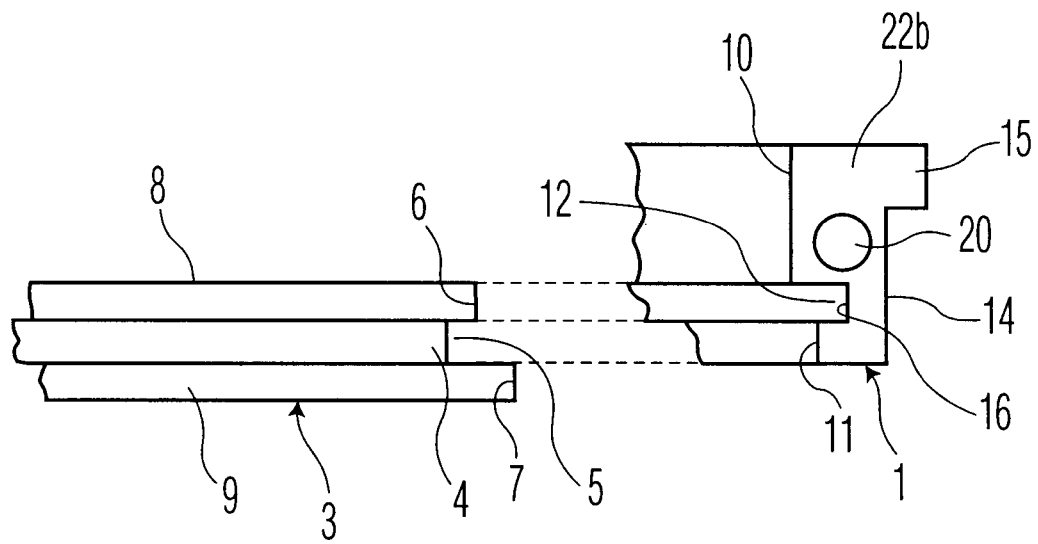
FIG. 3 shows a partial detail view of the interface between the gas plate and the split collar assembly.

In the partial detail of the interface between the gas plate 3 and a split collar section 1 shown in FIG. 3, a gas plate first rim 6 is shown extending peripherally around the circular edge of gas plate first side 8 and a gas plate second rim 7, is shown extending peripherally around the circular edge of gas plate second side 9. FIG. 3 also shows a detail of a split collar inner cylindrical surface 16, and a split collar section 1 first semicircular edge 10, the split collar section 1 second circular edge 11, and a semicircular slot 12 of the split collar section 1. The cross-section of slot 12 can be other than rectangular. As shown in FIG. 3, the alignment between the split collar assembly 1 and the gas plate 3 is configured such that the split collar second circular edge 11 fits into gas plate groove 5 with the band-shaped gasket 4 interposed, providing an electrical and thermal seal. Note also that groove 5 can be other than rectangular. In addition, FIG. 3 also shows the alignment of the gas plate first rim 6, and the split collar slot 12. The split collar section 1 has an outer cylindrical surface 14, and flange 15 which extends around the periphery of the collar section 1, and is used for mounting purposes in the associated reactor. Note that the functions of gasket 4 can be otherwise provided by other electrically and thermally conductive materials, such as adhesive material, or a carbon filled Silicone band.

Figure 4:
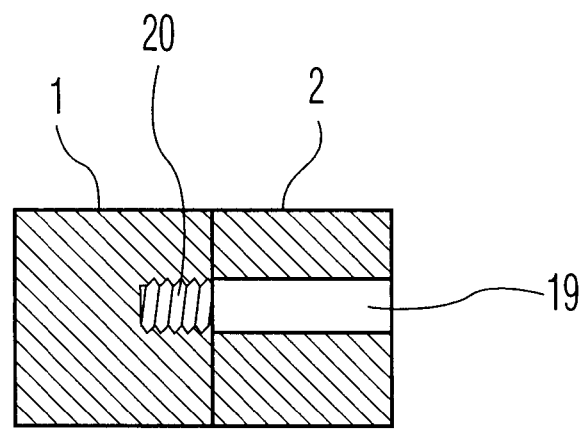
FIG. 4 is a cross-sectional view of the showerhead electrode assembly of FIG. 1B taken along 4—4.

Each of the split collar semicircular sections 1 and 2 is receptive of a first bolt 17 and a second bolt 18, respectively, as shown in FIGS. 1A and 1B, for inserting into through holes 19, respectively, extending into threaded and the blind holes 20 in the opposing semicircular section for securing sections 1 and 2 together to retain a gas plate 3 therebetween. In other words, a tangential through hole 19 is aligned with a corresponding tangential blind hole 20 in each of the opposing ends of split collar semicircular sections 1 and 2 (see FIG. 4).

Note that any suitable material can be used for the semicircular collar sections 1 and 2, such as graphite or aluminum, for example. Also, any suitable material can be used for bolts 17 and 18, such as graphite or stainless steel, for example. The gasket 4 can consist of any suitable electrically and thermally conductive material. The gas plate 3 typically consists of silicon, but any material having similar electrical and mechanical properties can be used.

The method of assembling a plasma reactor electrode assembly shown in FIGS. 1A and 1B for processing semiconductor wafers comprises the steps of placing an electrically and thermally conductive gasket 4 around the disk shaped gas plate 3 into a circular peripheral groove 5. The first semicircular collar section 1 is aligned with the second semicircular collar section 2, and the collar sections 1 and 2 are placed around gas plate 3 to form an enclosing collar section, such that mating inner surfaces 16 of each semicircular section 1 and 2 engages rim 6 of gas plate 3. Semicircular edge 11 of section 1 fits into circular groove 5 and abuts against gasket 4. In this manner, a dovetail connection is formed.

In the first embodiment of the invention, after the semicircular sections of collar 1 and 2 are placed around gas plate 3 and aligned, bolts 17 and 18, are inserted through tangential through holes 19 in each semicircular collar section 1 and 2, and threaded into each of two tangential threaded blind holes 20 of the associated opposing ends of semicircular collar sections 1 and 2, thereby securing gas plate 3 within the collar sections 1 and 2. The bolts or screws 17 and 18 are then tightened to secure the gas plate 3 within the collar sections 1 and 2 in contact with gasket 4. Gas plate 3 is easily removed from collar sections 1 and 2 by reversing the process.

Figure 5:
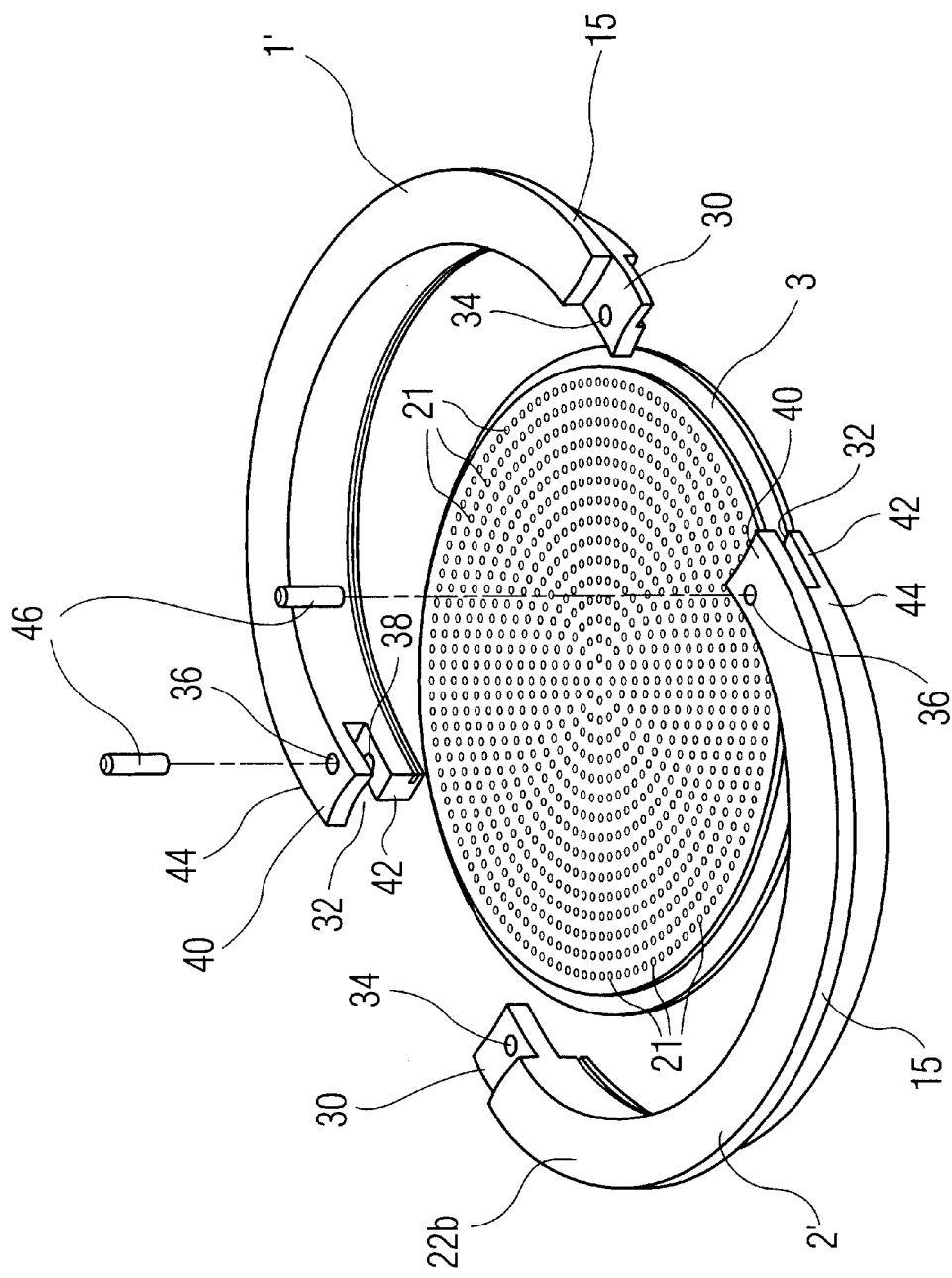
FIG. 5 is an exploded assembly view of an alternative and preferred embodiment of the showerhead electrode assembly, wherein a tab on one end of semicircular section of the split collar assembly is pinned within a notch in the opposing end of the other semicircular section.
Figure 6:
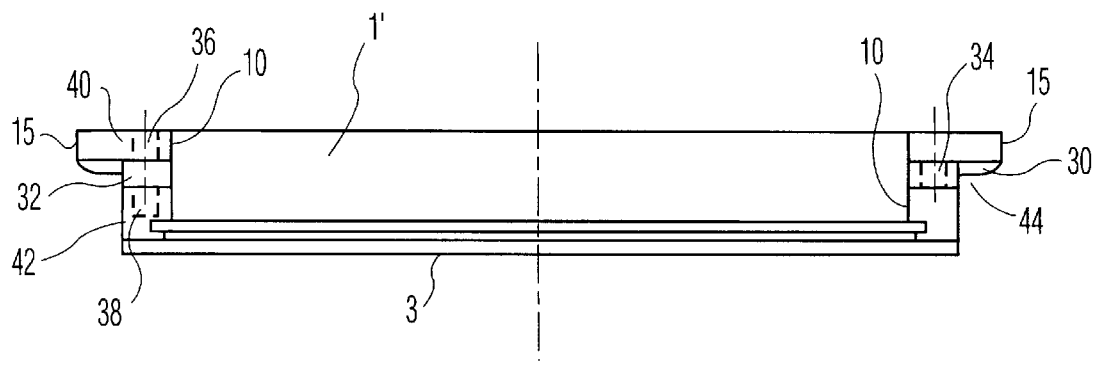
FIG. 6 is an end elevational view of one semicircular section of the tab and notch embodiment of FIG. 5, with a gas plate installed therein awaiting the other mating semicircular section which has an end view that is a mirror image of the one semicircular section.
Figure 7:
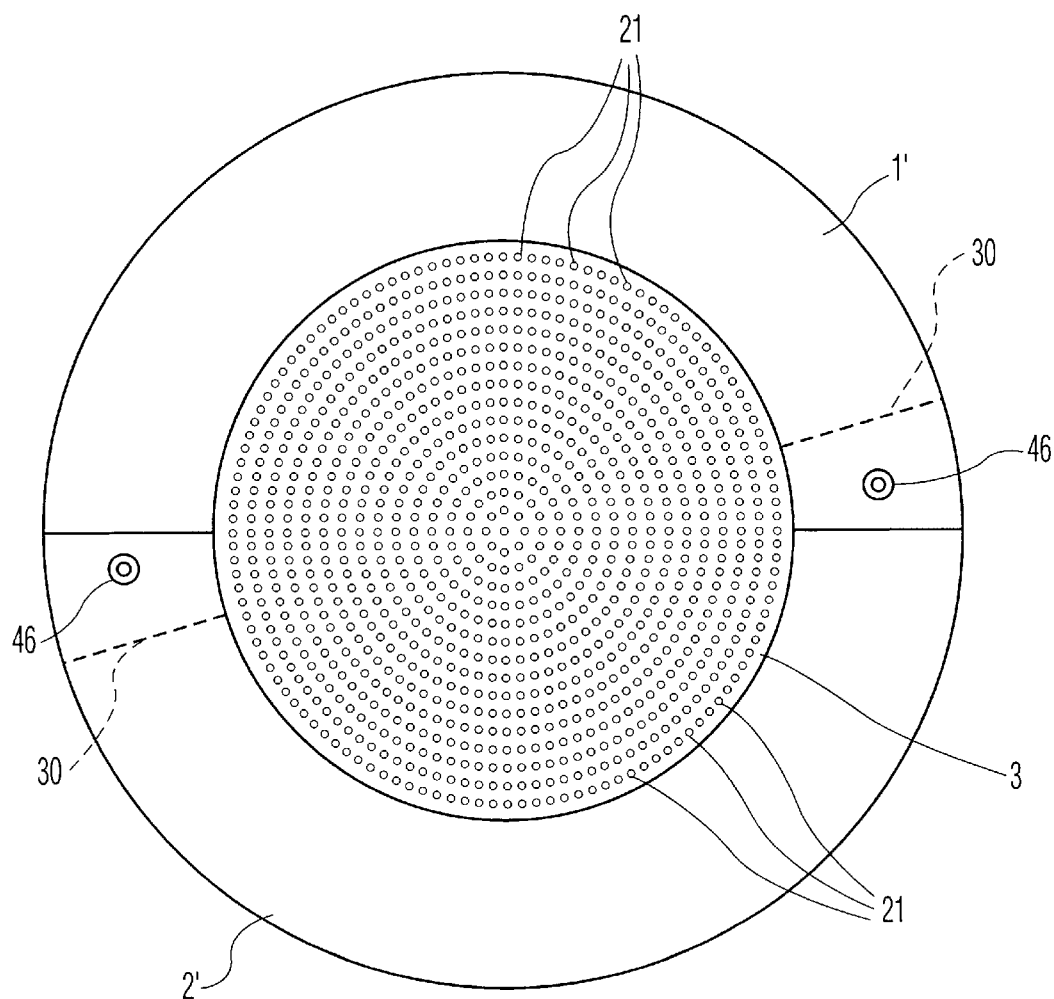
FIG. 7 is a top view of the tab and notch embodiment in an assembled state with a gas plate.

In a second and preferred embodiment of the invention (see FIGS. 5, 6, and 7), after the semicircular sections of collar 1' and 2' are placed around gas plate 3 and aligned such that a tab 30 of one is inserted into an opposing corresponding notch 32 of the other, respectively. The tab 30 of each is secured in the notch 32 of the other by inserting a pin into hole 36 in each of the two semicircular collar sections 1' and 2', respectively. Each notch 32 is located in a bifurcated region 44 of one end of each of two semicircular collar sections 1' and 2'. Each bifurcated region 44 has a top projecting section 40 having a top through hole 36, and a bottom projecting section 42 having a hole 38. The hole 38 is a smooth through hole if a pin 46 is used to secure collar sections 1' and 2'. If, however, a screw is used to secure collar sections 1' and 2', instead of a pin 46, then hole 38 can be a tapped through hole or a tapped blind hole.

Although various embodiments of the invention have been shown and described, they are not meant to be limiting. Those of skill in the art may recognize various modifications to these embodiments, which modifications are meant to be covered by the spirit and scope of the appended claims.

What is claimed is:

1. A plasma reactor electrode assembly for processing semiconductor wafers comprising:

a disk shaped gas plate, having a first side, a second side, and an outer peripheral edge, the plate having a plurality of gas passage holes distributed therethrough from the first side to the second side;

said outer peripheral edge of the gas plate having a circular peripheral groove, the groove defining a first rim proximate to the first side, and a second rim proximate to the second side; and a circular split collar assembly, including:
      a first semicircular section and a second semicircular section, the split collar assembly having a circular slot extending radially into an inner circumferential cylindrical wall thereof;
      means for mating the first semicircular section to the second semicircular section; and
      said circular slot having a first circular edge and a second circular edge above and below said slot; and
      said circular slot of said collar assembly being receptive of the first rim of said gas plate, the groove of said gas plate being receptive of the second edge of said collar assembly for securing the disk shaped gas plate therein.

2. A plasma reactor electrode assembly as in claim 1, further including, a conductive gasket interposed between the gas plate groove and the second edge of said collar assembly to provide to an electrically and thermally conductive seal therebetween.

3. The electrode assembly of claim 2, wherein the material of said gasket consists of a carbon filled Silicone.

4. The electrode assembly of claim 1, wherein the means for mating the first semicircular section to the second semicircular section comprises:

each semicircular section having a first end face and a second end face, each parallel to and lying along the diameter of the associated said semicircular section;

a tangential through hole normal to the first end face of each first and second semicircular sections;

a tangential internally threaded blind hole normal to the second face of each of said first and second semicircular section; and a pair of bolts; wherein each bolt is inserted through a tangential through hole of the first face of one of said first and second second semicircular sections, and threaded into a corresponding threaded blind hole of the second end of said first and second semicircular sections for securing the sections together.

5. The electrode assembly of claim 1, wherein the means for mating the first semicircular section to the second semicircular section comprises:

each semicircular section having a first end face and a second end face each parallel to and lying along the diameter of the associated said semicircular section, the first and second end faces of each being at opposite ends of said first and second semicircular sections, respectively;

each semicircular section first end face having a tab projecting therefrom;

each semicircular section first end face tab having a hole therethrough;

each semicircular section second end face having a bifurcated region including a top projecting section, and a bottom projecting section, the top projecting section and the bottom projecting section defining a notch therebetween;

the top projecting section, and bottom projecting section each having a hole therein;

the top projecting section hole, and the bottom projecting section hole of one of said first and second semicircular sections, and the tab hole of the other of said first and second semicircular sections all being aligned, when a respective said notch of one section is receptive of a respective said tab of the other section; and each of said first and second semicircular sections being receptive of a pinning means passing through a respective top projecting section hole and associated bottom projecting section hole, and through the tab hole of the other corresponding semicircular section, for retaining said tabs in said notches in the assembled state of said first and second semicircular sections.

6. The electrode assembly of claim 5, wherein each pinning means is a pin.

7. The electrode assembly of claim 5, wherein each pinning means is a screw, and wherein each hole of said bottom bifurcated sections is threaded.

8. The electrode assembly of claim 1, wherein the material of the gas plate is silicon.

9. The electrode assembly of claim 1, wherein the material of the split collar is graphite.

10. The electrode assembly of claim 1, wherein said circular split collar assembly has an outer cylindrical surface with a radial flange.

11. The electrode assembly of claim 1, wherein the disk shaped gas plate circular peripheral groove is rectangular.

12. The electrode assembly of claim 1, wherein said inner circular slot of said circular split collar assembly is rectangular.

13. The electrode assembly of claim 1, wherein the conductive gasket is band shaped.

14. A plasma reactor electrode assembly for processing semiconductor wafers comprising:

a disk shaped gas plate, having a first plasma facing first side, a gas source facing second side, and an outer peripheral edge having a peripheral groove, the groove defining a first rim proximate to the first side, and a second rim proximate to the second side, the plate having a plurality of gas passage holes therethrough from the first side to the second side;

a circular split collar assembly, comprised of a first semicircular section and a second semicircular section, each semicircular section having a first end face and a second end face, the split collar assembly having an inner cylindrical surface having a circumferential slot, the slot defining a first circular edge and a second circular edge above and below said slot, respectively;

a tangential through hole normal to the first end face of said first and second semicircular sections;

a tangential internally threaded blind hole normal to the second end face of each semicircular section;

a pair of bolts;

each bolt passing through a tangential through hole, and threading into a corresponding threaded blind hole for securing the first and second semicircular sections together; and said slot of said collar assembly being receptive of the first rim, said groove of the gas plate being receptive of the second edge of the collar assembly.

15. A plasma reactor electrode assembly, according to claim 14, wherein a band-shaped conductive gasket is interposed between the gas plate groove and the second edge of said collar assembly to provide an electrically and thermally conductive seal therebetween.

16. A plasma reactor electrode assembly for processing semiconductor wafers comprising:

a disk shaped gas plate, having a first plasma facing first side, a gas source facing second side, and an outer peripheral edge having a peripheral groove, the groove defining a first rim proximate to the first side, and a second rim proximate to the second side, the plate having a plurality of gas passage holes therethrough from the first side to the second side;

a circular split collar assembly, comprised of a first semicircular section and a second semicircular section, each semicircular section having a first end face and a second end face, the split collar assembly having an inner cylindrical surface having a circumferential slot, the slot defining a first circular edge and a second circular edge above and below said slot, respectively, whereby the first and second end faces of one of said first and second semicircular sections are at opposite ends relative to the other;

each semicircular section first end face having a tab projecting therefrom;

each semicircular section tab having a hole therethrough;

each semicircular section second end face having a bifurcated region including a top projecting section, and a bottom projecting section, the top projecting section and the bottom projecting section defining a notch therebetween;

the top projecting section, and bottom projecting section each having a hole therethrough;

the top projecting section hole, and the bottom projecting section hole of one of said first and second semicircular sections, and the tab hole of the other of said first and second semicircular sections all are aligned when a respective said notch is receptive of a respective said tab; and a pin passing through the hole in each said top projecting section of one section, the associated hole in the tab of the other section and the hole in the bottom projecting section of the one section, for retaining said tabs in said notches in the assembled state of said first and second semicircular sections;

said slot of said collar assembly being receptive of the first rim of said gas plate, said groove of the gas plate being receptive of the second edge of the collar assembly.

17. A plasma reactor electrode assembly, according to claim 16, wherein a band-shaped conductive gasket is interposed between the gas plate groove and the second edge of said collar assembly to provide an electrically and thermally conductive seal therebetween.

18. A method of making a plasma reactor electrode assembly for processing semiconductor wafers, comprising the steps of:

forming a peripheral groove in a disk-shaped gas plate having a plurality of individual gas passage holes;

placing an electrically and thermally conductive gasket material into a peripheral groove formed in said disk-shaped gas plate; and securing opposing ends of two semicircular collar sections together around said gas plate to form an enclosing collar section, such that an inner circumferential slot formed by said collar sections engages in a dovetail mating with the groove of the gas plate and the gasket.

* * * * *